(12) United States Patent
Jimenez-Olivares et al.

(10) Patent No.: US 10,600,494 B2
(45) Date of Patent: Mar. 24, 2020

(54) METHODS AND APPARATUSES FOR SELF-TRIMMING OF A SEMICONDUCTOR DEVICE

(71) Applicant: MICRON TECHNOLOGY, INC., Boise, ID (US)

(72) Inventors: Miguel Jimenez-Olivares, Munich (DE); Maksim Kuzmenka, Munich (DE)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 15/946,456

(22) Filed: Apr. 5, 2018

(65) Prior Publication Data
US 2019/0311773 A1 Oct. 10, 2019

(51) Int. Cl.
| | | |
|---|---|---|
| G11C 29/02 | (2006.01) | |
| G11C 5/14 | (2006.01) | |
| G11C 11/4074 | (2006.01) | |
| G11C 29/50 | (2006.01) | |

(52) U.S. Cl.
CPC ............ G11C 29/028 (2013.01); G11C 5/147 (2013.01); G11C 29/021 (2013.01); *G11C 11/4074* (2013.01); *G11C 29/50008* (2013.01)

(58) Field of Classification Search
CPC .................................................. G11C 29/028
USPC ...................................... 365/189.07, 185.25
See application file for complete search history.

(56) References Cited

U.S. PATENT DOCUMENTS

2018/0164163 A1* 6/2018 Pandiri ..................... G01K 7/01

* cited by examiner

*Primary Examiner* — Jason Lappas
(74) *Attorney, Agent, or Firm* — Dorsey & Whitney LLP

(57) ABSTRACT

Methods and apparatuses are provided for self-trimming of a semiconductor device. An example apparatus includes a semiconductor device including a self-trimming circuit configured to receive a reference voltage and a test command signal. The self-trimming circuit is configured to convert the reference voltage to a target voltage based on the test command signal and further configured to adjust a voltage trim code until an internal voltage matches the target voltage to determine a trim level associated with the internal voltage.

13 Claims, 6 Drawing Sheets

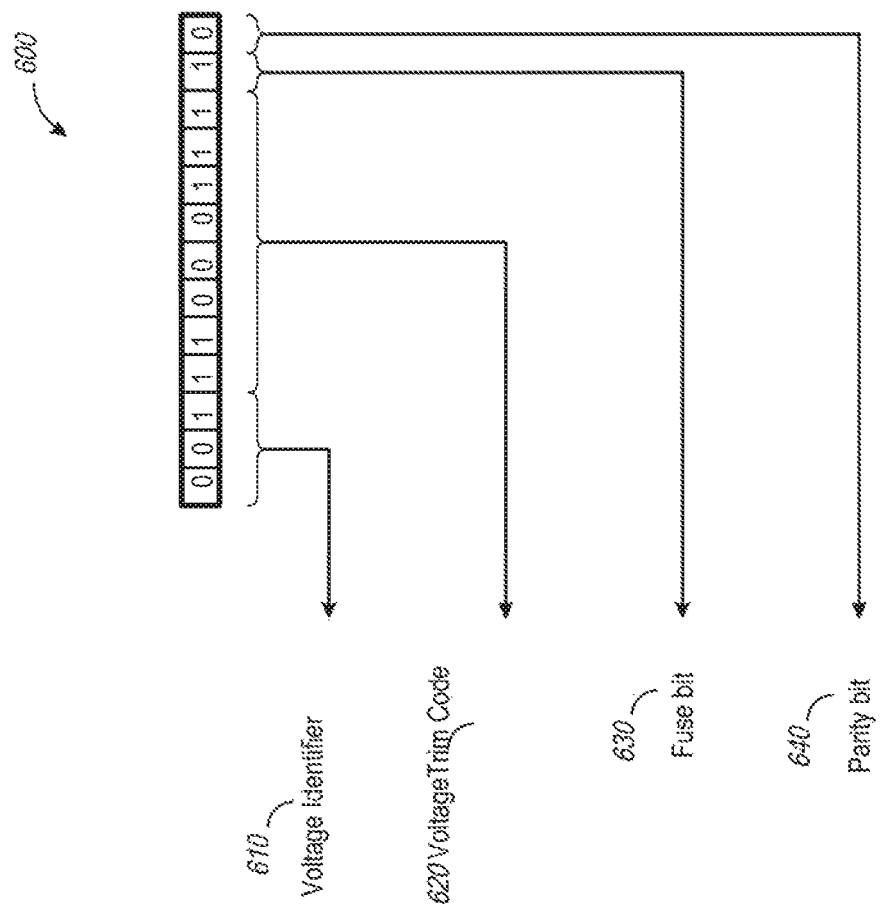

METHODS AND APPARATUSES FOR SELF-TRIMMING OF A SEMICONDUCTOR DEVICE

BACKGROUND

High data reliability, high speed of memory access, and reduced chip size are features that are demanded from semiconductor memory. In recent years, there has been an effort to further increase the speed of memory access.

Conventional semiconductor devices include many different circuits that operate at different voltage levels, and as circuitry continues toward reduction in size, precision and accuracy of operation voltages used within the semiconductor device becomes even more critical to reliable operation. Often, the internal voltages are derived from a reference voltage provided to the semiconductor device using internal voltage generator circuitry. Due to process, voltage, and temperature (PVT) differences that may exist between two similar semiconductor devices, trimming of the voltage generator circuitry may be implemented to adjust the various voltages. Conventional trimming processes include a tester controlling the trimming process, and may be time consuming, as the semiconductor devices are not able to be trimmed in parallel using a single tester.

BRIEF DESCRIPTION OF THE DRAWINGS

FIG. 6 is an example frame for a test command signal during a self-trimming operation in accordance with an embodiment of the disclosure.

DETAILED DESCRIPTION OF THE EMBODIMENTS

Various embodiments of the disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the disclosure. The various embodiments disclosed herein are not necessary mutually exclusive, as some disclosed embodiments can be combined with one or more other disclosed embodiments to form new embodiments.

Figure 1:
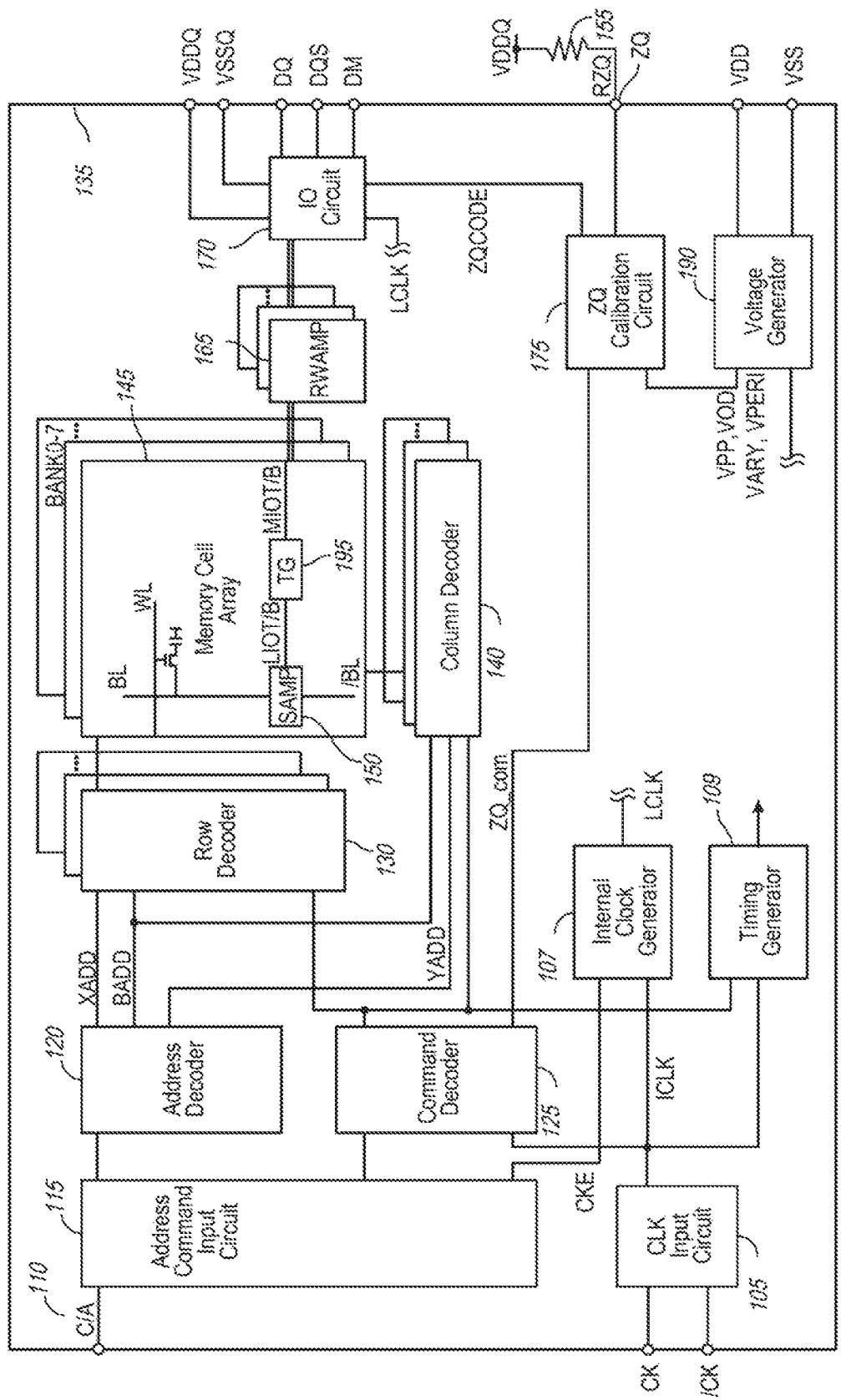
FIG. 1 is a schematic block diagram of a semiconductor device, in accordance with an embodiment of the disclosure.

FIG. 1 is a schematic block diagram of a semiconductor device 100, in accordance with an embodiment of the disclosure. The semiconductor device 100 may be a volatile memory such as a SRAM or DRAM, or a non-volatile memory such as a FLASH memory or a ferroelectric memory. In some embodiments of the disclosure, the semiconductor memory device 100 is a Double Data Rate (DDR) memory, such as a Low Power Double Data Rate 5 (LPDDR5) memory. The semiconductor device 100 may include a chip 135 and a ZQ resistor (RZQ) 155. The chip 135 may include a clock input circuit 105, an internal clock generator 107, a timing generator 109, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, the ZQ resistor (RZQ) 155, a ZQ calibration circuit 175, and a voltage generator 190. The semiconductor device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate 160, for example, a memory module substrate, a mother board or the like.

The memory cell array 145 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, and a ZQ calibration command that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

Because individual semiconductor devices may have slight differences to PVT variance, the voltage generator circuit 190 may include self-trimming circuitry to automatically trim voltage regulators used to provide the internal voltages for the semiconductor device 100. The self-trimming circuitry may receive a reference voltage VREF from a tester at the ZQ pad and a test command signal TSTCMD at the DQ pad. The TSTCMD signal may include an identifier enumerating an internal voltage to be trimmed. In some examples, the TSTCMD signal may also indicate a target voltage of the internal voltage. In response to the VREF voltage and the TSTCMD, the self-trimming circuitry may set a voltage converter to convert the VREF voltage to a target voltage, and may iteratively adjust a voltage trim code controls an output voltage of a reference voltage regulator until the output voltage of the reference voltage regulator matches the target voltage. In response to a determination that the output voltage provided by the reference voltage regulator matches the target voltage, the self-trimming circuitry may permanently store the voltage trim code, for example, by programming a corresponding set of anti-fuses in an anti-fuse bank. The process may repeat for each voltage to be trimmed. Because the semiconductor device 100 includes self-trimming circuitry that allows autonomous trimming of voltages, voltage trimming may be performed on multiple semiconductor devices in parallel from a single tester, which may be more efficient as compared systems where the tester controls the trim operation.

Figure 2:
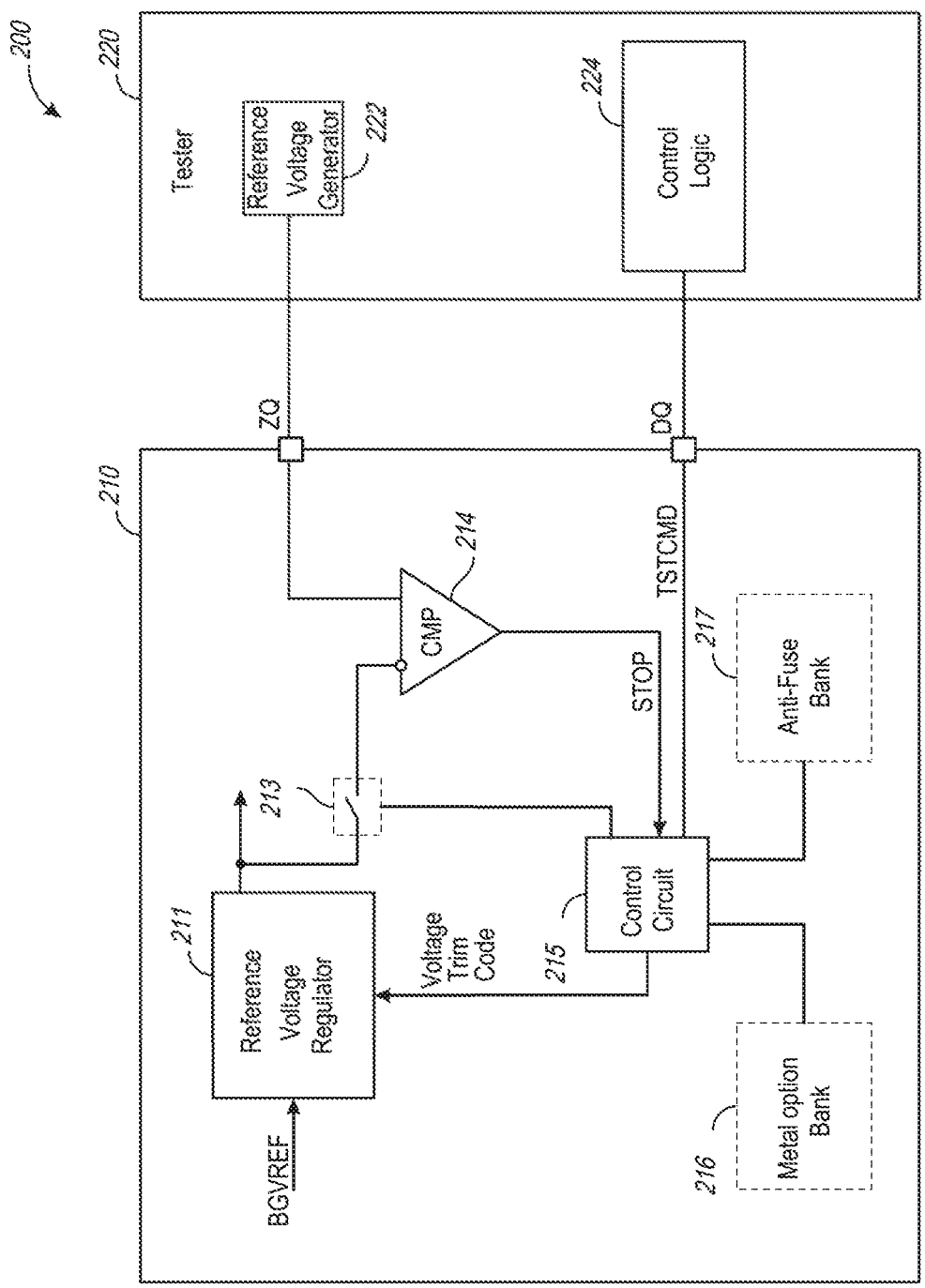
FIG. 2 is a circuit diagram of a system that includes a self-trimming circuit in accordance with an embodiment of the disclosure.

FIG. 2 is a circuit diagram of a system 200 that includes a self-trimming circuit 210 in accordance with an embodiment of the disclosure. The voltage generator circuit 190 of FIG. 1 may implement the self-trimming circuit 210, in some examples. The self-trimming circuit 210 may be coupled to a tester 220 to receive a reference voltage VREF and a test command signal TSTCMD.

The self-trimming circuit 210 may include a reference voltage regulator 211, a switching circuit 213, a comparator 214, a control circuit 215, a metal option bank 216, and an anti-fuse bank 217. The reference voltage regulator 211 may receive a band gap reference voltage BGVREF and may provide an output voltage to the switching circuit 213 based on a voltage code from the control circuit 215. The switching circuit 213 may provide the output voltage to the comparator 214 in response to a switch signal from the control circuit 215. The comparator 214 may also receive a VREF voltage from the ZQ pad. The comparator 214 may compare the voltage from the switching circuit 213 with the VREF voltage and provide a stop signal to the control circuit 215 based on the comparison. The control circuit 215 may receive the TSTCMD signal. In some examples, the control circuit 215 may retrieve the target voltage code from the TSTCMD signal. In other examples, the control circuit 215 may retrieve the target voltage code from the metal option bank 216 based on a voltage identifier included in the TSTCMD signal. The metal option bank 216 may include multiple sets of metal switches that are each programmed (e.g., opened or shorted) in particular patterns. A particular set of the metal switches is read to determine a code. The selected set of metal switches may be determined based on the voltage identifier from the TSTCMD signal. The control circuit 215 may adjust the voltage trim code based on a value of the stop signal from the comparator 214. In response to the stop signal indicating that the target voltage and the voltage from the reference voltage regulator 211 match, the control circuit 215 may program the anti-fuse bank 217 with a voltage trim code that resulted in a match.

The tester 220 may include a reference voltage generator 222 and a control logic 224. The reference voltage generator 222 may provide a stable reference voltage to the self-trimming circuit 210 at a ZQ pad. The control logic 224 may send the TSTCMD signal to the control logic 224 of the self-trimming circuit 210 at a DQ pad to initiate a self-trimming operation.

In operation, the self-trimming circuit 210 is configured to perform a self-trimming operation to set a trim level for a target voltage. The self-trimming operation is initiated by the tester 220, in some examples. For example, the tester 220 provides a stable VREF voltage to the self-trimming circuit 210, along with the TSTCMD signal. The VREF voltage may be VDD, in some examples. The TSTCMD signal may include a voltage identifier indicating which voltage is to be trimmed, e.g., a first voltage, second voltage, etc. The voltage identifier may be used by the self-trimming circuit 210 to determine a target voltage code (e.g., via the metal option bank 216) to set the target voltage and to program a set of anti-fuses of the anti-fuse bank 217 to program when the voltage trim code is determined. In some examples, the TSTCMD signal may include the target voltage code, which may be used by the self-trimming circuit 210, rather than using a target voltage code from the metal option bank 216.

In response to receipt of the TSTCMD signal, the control circuit 215 may either retrieve a target voltage code from the metal option bank 216, or retrieve the target voltage code from the TSTCMD signal. The target voltage code retrieved from the metal option bank 216 may be based on a voltage identifier included in the TSTCMD signal.

Further in response to the TSTCMD signal, the control circuit 215 may provide an initial voltage trim code to the reference voltage regulator 211 based on the target voltage code and may provide the switch signal to the switching circuit 213 to connect the output of the reference voltage regulator 211 to the second input of the comparator 214. The voltage trim code may adjust an output voltage provided by the reference voltage regulator 211. For example, the voltage trim code may adjust an impedance of a component of the reference voltage regulator 211 to adjust the output voltage. The comparator 214 compares the VREF voltage to the output of the reference voltage regulator 211 and provides the stop signal having a value based on the comparison. The control circuit 215 adjusts the voltage trim code provided to the reference voltage regulator 211 based on the stop signal. When the stop signal indicates that the target voltage matches the output from voltage from the reference voltage regulator 211, in some examples, the control circuit 215 completes the self-trimming process by programming a set of anti-fuses of the anti-fuse bank 217. The set of anti-fuses is selected based on the voltage identifier in the TSTCMD signal. In other examples, the anti-fuses are not programmed during the self-trimming operation. Because the self-trimming circuit 210 allows a semiconductor device to complete a self-trimming operation autonomously, the self-trimming circuit 210 may be connected to multiple semiconductor devices to perform trimming operations in parallel, which is more efficient than systems where the tester controls the trimming operation.

Figure 3:
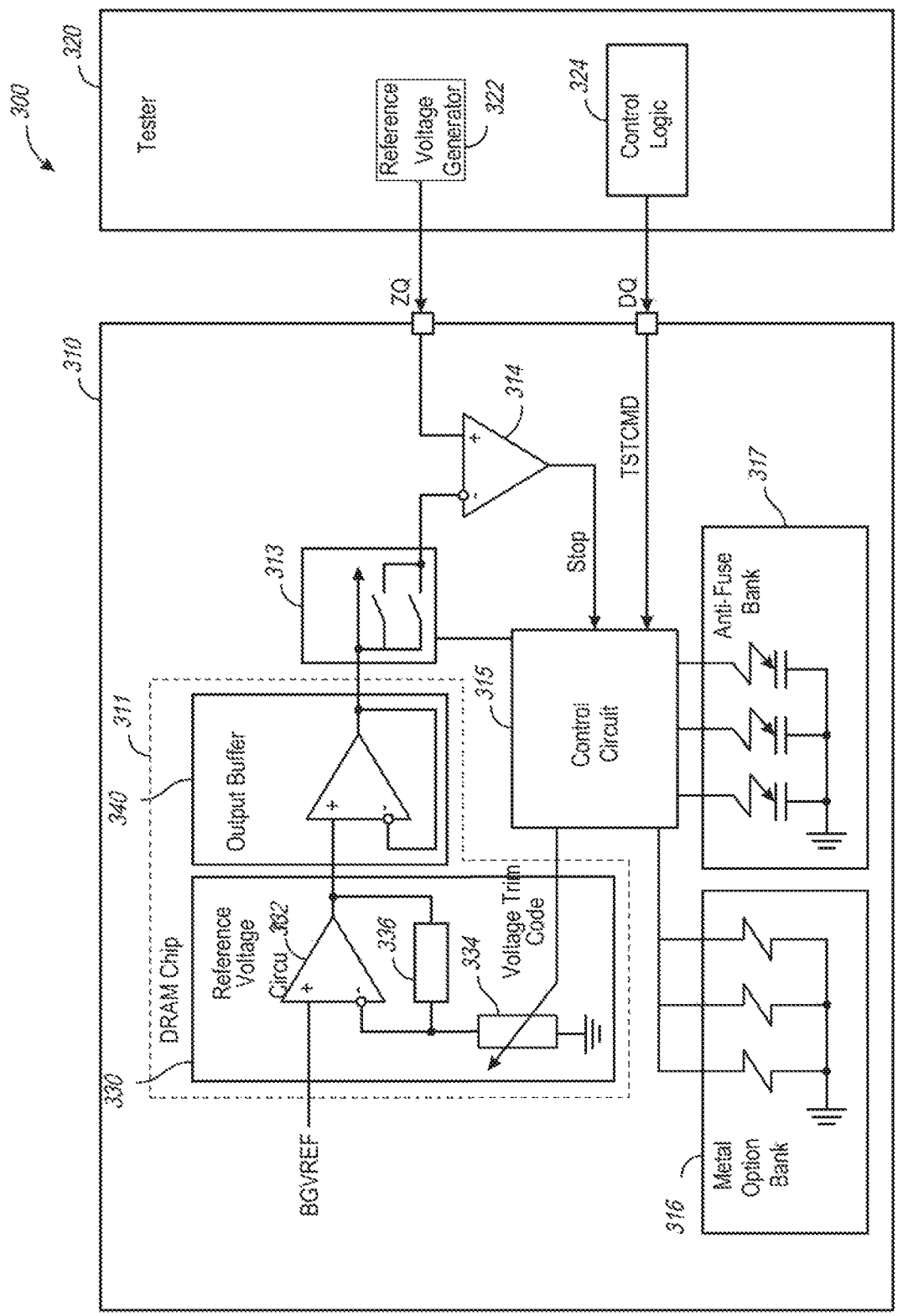
FIG. 3 is a circuit diagram of a system that includes a self-trimming circuit in accordance with an embodiment of the disclosure.

FIG. 3 is a circuit diagram of a system 300 that includes a self-trimming circuit 310 in accordance with an embodiment of the disclosure. The voltage generator circuit 190 of FIG. 1 may implement the self-trimming circuit 310, in some examples. The self-trimming circuit 310 may be coupled to a tester 320 to receive a reference voltage VREF and a test command signal TSTCMD.

The self-trimming circuit 310 may include a reference voltage regulator 311, a switching circuit 313, a comparator 314, a control circuit 315, a metal option bank 316, and an anti-fuse bank 317. The reference voltage regulator 311 may include reference voltage circuit 330 and an output buffer 340. The reference voltage circuit 330 includes an amplifier 332 configured to receive a band-gap reference voltage BGVREF and to provide an output voltage to the output buffer 340 based on values of the variable impedance device 334 and impedance 336. The variable impedance device 334 is adjusted based on the voltage trim code from the control circuit 315. The output buffer 340 drives the output voltage from the amplifier 332 to the switching circuit 313. The switching circuit 313 may provide the output voltage to the comparator 314 in response to a switch signal from the control circuit 315. The comparator 214 may also receive a VREF voltage from the ZQ pad and provide the target voltage to the comparator 314. The comparator 314 may compares the voltage from the switching circuit 313 with the VREF voltage and provides a stop signal to the control circuit 315 based on the comparison. The control circuit 315 may receive the TSTCMD signal. The control circuit 315 may retrieve the target voltage code from the metal option bank 316 based on a voltage identifier included in the TSTCMD signal. The metal option bank 316 may include multiple sets of metal switches that are each programmed (e.g., opened or shorted) in particular patterns. A particular set of the metal switches is read to determine a code. The selected set of metal switches may be determined based on the voltage identifier from the TSTCMD signal. The control circuit 315 may adjust the voltage trim code based on a value of the stop signal from the comparator 314. In response to the stop signal indicating that the target voltage and the voltage from the reference voltage regulator 311 match, the control circuit 315 may program the anti-fuse bank 317 with a voltage trim code that resulted in a match.

The tester 320 may include a reference voltage generator 322 and a control logic 324. The reference voltage generator 322 may provide a stable reference voltage to the self-trimming circuit 310 at a ZQ pad. The control logic 324 may send the TSTCMD signal to the control logic 324 of the self-trimming circuit 310 at a DQ pad to initiate a self-trimming operation.

In operation, the self-trimming circuit 310 is configured to perform a self-trimming operation to set a trim level for a target voltage. The self-trimming operation is initiated by the tester 320, in some examples. For example, the tester 320 provides a stable VREF voltage to the self-trimming circuit 310, along with the TSTCMD signal. The VREF may be VDD, in some examples. The TSTCMD signal may include a voltage identifier indicating which voltage is to be trimmed, e.g., a first voltage, second voltage, etc. The voltage identifier may be used by the self-trimming circuit 310 to determine a target voltage code (e.g., via the metal option bank 316) to set the target voltage and to program a set of anti-fuses of the anti-fuse bank 317 to program when the voltage trim code is determined.

In response to receipt of the TSTCMD signal, the control circuit 315 may retrieve a target voltage code from the metal option bank 316 based on a voltage identifier included in the TSTCMD signal.

Further in response to the TSTCMD signal, the control circuit 315 may provide an initial voltage trim code to the variable impedance device 334 based on the target voltage code and may provide the switch signal to the switching circuit 313 to connect the output of the output buffer 340 to the second input of the comparator 314. The voltage trim code may adjust an impedance of the variable impedance device 334, which may adjust an output voltage provided by the amplifier 332. The output buffer 340 drives the output voltage of the amplifier 332 to the comparator 314 via the switching circuit 313. The comparator 314 compares the VREF voltage to the output voltage from the output buffer 340 and provides the stop signal having a value based on the comparison. The control circuit 315 adjusts the voltage trim code provided to the reference voltage regulator 311 based on the stop signal. When the stop signal indicates that the target voltage matches the output voltage from the reference voltage regulator 311, in some examples, the control circuit 315 completes the self-trimming process by programming a set of anti-fuses of the anti-fuse bank 317. The set of anti-fuses is selected based on the voltage identifier in the TSTCMD signal. In other examples, the anti-fuses are not programmed during the self-trimming operation.

Figure 4:
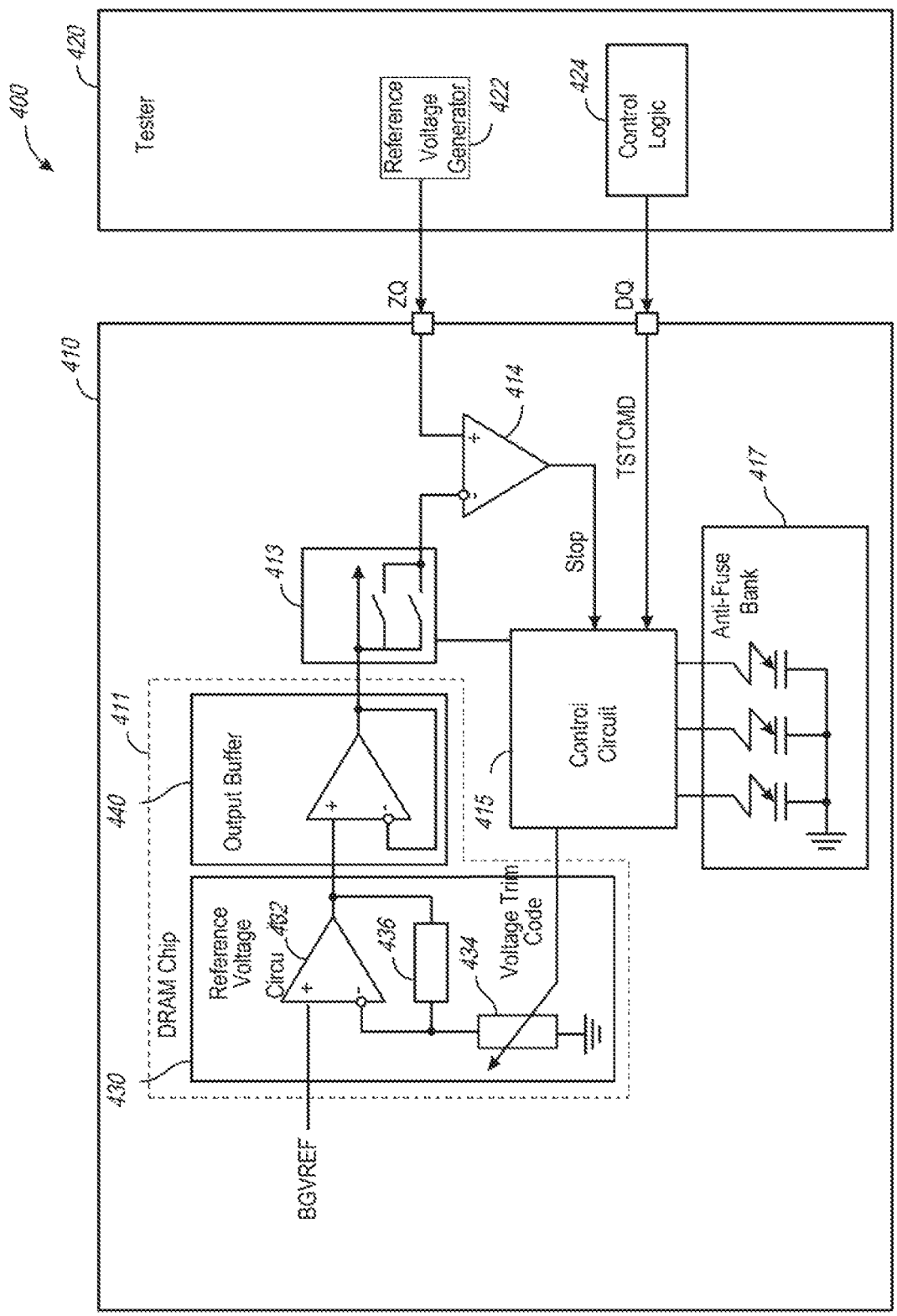
FIG. 4 is a circuit diagram of a system that includes a self-trimming circuit in accordance with an embodiment of the disclosure.

FIG. 4 is a circuit diagram of a system 400 that includes a self-trimming circuit 410 in accordance with an embodiment of the disclosure. The voltage generator circuit 190 of FIG. 1 may implement the self-trimming circuit 410, in some examples. The self-trimming circuit 410 may be coupled to a tester 420 to receive a reference voltage VREF and a test command signal TSTCMD.

The self-trimming circuit 410 may include a reference voltage regulator 411, a switching circuit 413, a comparator 414, a control circuit 415, and an anti-fuse bank 417. The reference voltage regulator 411 may include reference voltage circuit 430 and an output buffer 440. The reference voltage circuit 430 includes an amplifier 432 configured to receive a band-gap reference voltage BGVREF and to provide an output voltage to the output buffer 440 based on values of the variable impedance device 434 and impedance 436. The variable impedance device 434 is adjusted based on the voltage trim code from the control circuit 415. The output buffer 440 drives the output voltage from the amplifier 432 to the switching circuit 413. The switching circuit 413 may provide the output voltage to the comparator 414 in response to a switch signal from the control circuit 415. The comparator 414 may also receive a VREF voltage from the ZQ pad. The comparator 414 may compare the voltage from the switching circuit 413 with the VREF voltage and provide a stop signal to the control circuit 415 based on the comparison. The control circuit 415 may receive the TSTCMD signal. In some examples, the control circuit 415 may retrieve the target voltage code value from the TSTCMD signal. The control circuit 415 may adjust the voltage trim code based on a value of the stop signal from the comparator 414. In response to the stop signal indicating that the target voltage and the voltage from the reference voltage regulator 411 match, the control circuit 415 may program the anti-fuse bank 417 with a voltage trim code that resulted in a match.

The tester 420 may include a reference voltage generator 422 and a control logic 424. The reference voltage generator 422 may provide a stable reference voltage to the self-trimming circuit 410 at a ZQ pad. The control logic 424 may send the TSTCMD signal to the control logic 424 of the self-trimming circuit 410 at a DQ pad to initiate a self-trimming operation.

In operation, the self-trimming circuit 410 is configured to perform a self-trimming operation to set a trim level for a target voltage. The self-trimming operation is initiated by the tester 420, in some examples. For example, the tester 420 provides a stable VREF voltage to the self-trimming circuit 410, along with the TSTCMD signal. The VREF may be VDD, in some examples. The TSTCMD signal may include a voltage identifier indicating which voltage is to be trimmed, e.g., a first voltage, second voltage, etc. The voltage identifier may be used by the self-trimming circuit 410 to program a set of anti-fuses of the anti-fuse bank 417 to program when the voltage trim code is determined. In some examples, the TSTCMD signal may include the target voltage used by the self-trimming circuit 410.

In response to receipt of the TSTCMD signal, the control circuit 415 may decode the TSTCMD signal to retrieve a target voltage code.

Further in response to the TSTCMD signal, the control circuit 415 may provide an initial voltage trim code to the variable impedance device 434 based on the target voltage code and may provide the switch signal to the switching circuit 413 to connect the output of the output buffer 440 to the second input of the comparator 414. The voltage trim code may adjust an impedance of the variable impedance device 434, which may adjust an output voltage provided by the amplifier 432. The output buffer 440 drives the output voltage of the amplifier 432 to the comparator 414 via the switching circuit 413. The comparator 414 compares the VREF voltage to the output voltage from the output buffer 440 and provides the stop signal having a value based on the comparison. The control circuit 415 adjusts the voltage trim code provided to the reference voltage regulator 411 based on the stop signal. When the stop signal indicates that the target voltage matches the output voltage from the reference voltage regulator 411, in some examples, the control circuit 415 completes the self-trimming process by programming a set of anti-fuses of the anti-fuse bank 417. The set of anti-fuses is selected based on the voltage identifier in the TSTCMD signal. In other examples, the anti-fuses are not programmed during the self-trimming operation.

Figure 5:
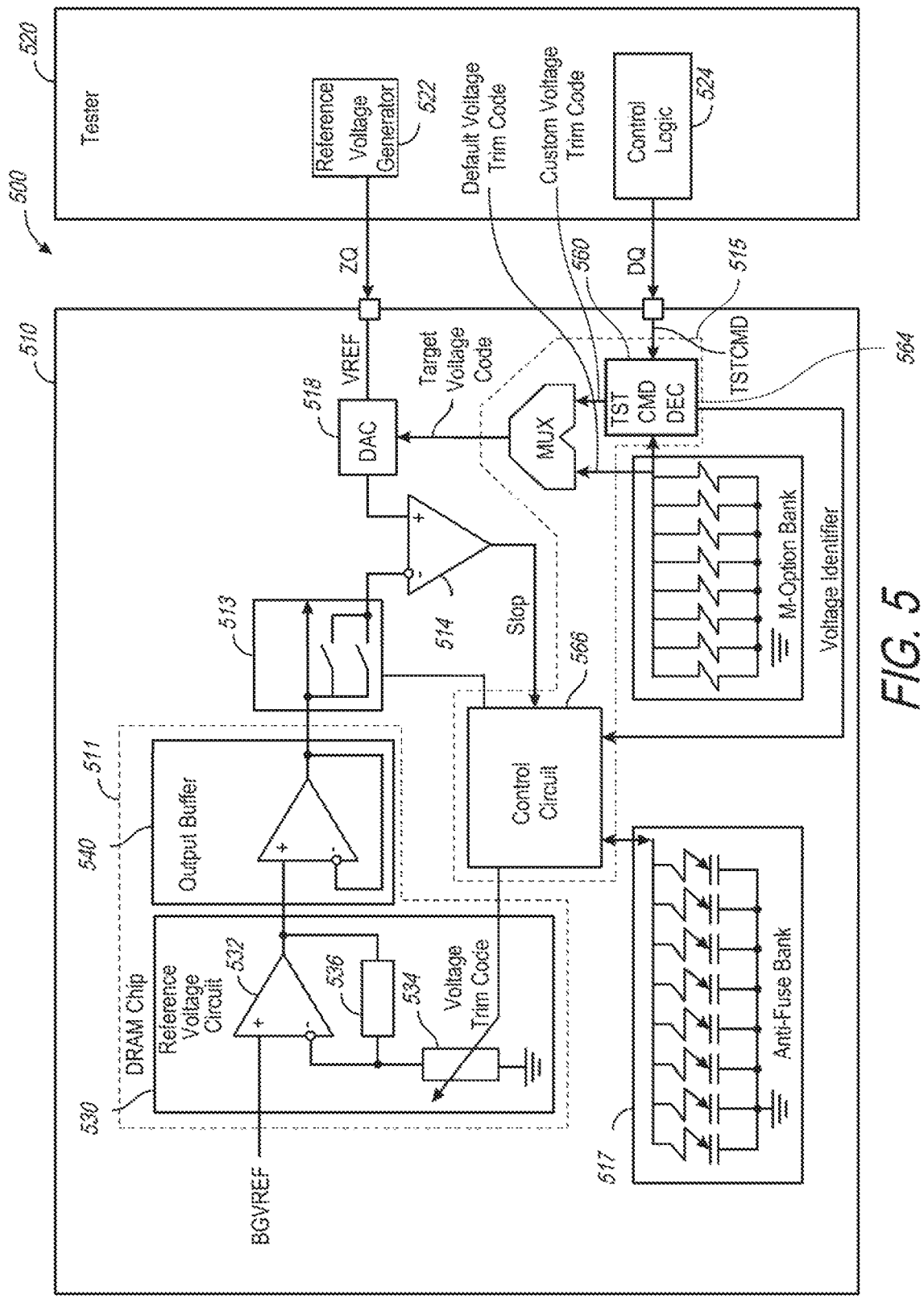
FIG. 5 is a circuit diagram of a system that includes a self-trimming circuit in accordance with an embodiment of the disclosure.

FIG. 5 is a circuit diagram of a system 500 that includes a self-trimming circuit 510 in accordance with an embodiment of the disclosure. The voltage generator circuit 190 of FIG. 1 may implement the self-trimming circuit 510, in some examples. The self-trimming circuit 510 may be coupled to a tester 520 to receive a reference voltage VREF and a test command signal TSTCMD.

The self-trimming circuit 510 may include a reference voltage regulator 511, a switching circuit 513, a comparator 514, a control circuit 515, a metal option bank 516, an anti-fuse bank 517, and a DAC 518. The reference voltage regulator 511 may include reference voltage circuit 530 and an output buffer 540. The control circuit 515 includes a multiplexer 560, a test command decoder 564, and a control logic 566. The test command decoder 564 is configured to receive the TSTCMD signal and to decode the TSTCMD signal to retrieve a voltage identifier, and whether the target voltage is a default voltage based on a default target voltage code programmed into the metal option bank 516, or is a custom target voltage based on a custom target voltage code provided in the TSTCMD signal. The metal option bank 516 may include multiple sets of metal switches that are each programmed (e.g., opened or shorted) in particular patterns. A particular set of the metal switches is read to determine a code. The selected set of metal switches may be determined based on the voltage identifier from the TSTCMD signal. The test command decoder 564 provides the custom target voltage code to a first input of the multiplexer 560 and causes the metal option bank 516 to provide the default target voltage code to a second input of the multiplexer 560. The test command decoder 564 further provides a control signal to the multiplexer 560 based on the TSTCMD signal to select one of the default target voltage code or the custom target voltage code to provide to the DAC 518. The test command decoder 564 further provides the voltage identifier to the control logic 566. The control logic 566 provides an initial voltage trim code to the reference voltage regulator 511 based on the voltage identifier. The reference voltage circuit 530 includes an amplifier 532 configured to receive a band-gap reference voltage BGVREF and to provide an output voltage to the output buffer 540 based on values of the variable impedance device 534 and impedance 536. The variable impedance device 534 is adjusted based on the voltage trim code from the control logic 566. The output buffer 540 drives the output voltage from the amplifier 532 to the switching circuit 513. The switching circuit 513 may provide the output voltage to the comparator 514 in response to a switch signal from the control circuit 515. The DAC 518 may convert the VREF voltage to a target voltage in response to a target voltage code from the multiplexer 560 and provides the target voltage to the comparator 514. The comparator 514 may compare the voltage from the switching circuit 513 with the output of the DAC 518 and provide a stop signal to the control logic 566 based on the comparison. The control logic 566 may adjust the voltage trim code based on a value of the stop signal from the comparator 514. In response to the stop signal indicating that the target voltage and the voltage from the reference voltage regulator 511 match, the control logic 566 may program the anti-fuse bank 517 with a voltage trim code that resulted in a match.

The tester 520 may include a reference voltage generator 522 and a control logic 524. The reference voltage generator 522 may provide a stable reference voltage to the self-trimming circuit 510 at a ZQ pad. The control logic 524 may send the TSTCMD signal to the control logic 524 of the self-trimming circuit 510 at a DQ pad to initiate a self-trimming operation.

In operation, the self-trimming circuit 510 is configured to perform a self-trimming operation to set a trim level for a target voltage. The self-trimming operation is initiated by the tester 520, in some examples. For example, the tester 520 provides a stable VREF voltage to the self-trimming circuit 510, along with the TSTCMD signal. The VREF may be VDD, in some examples. The TSTCMD signal may include a voltage identifier indicating which voltage is to be trimmed, e.g., a first voltage, second voltage, etc. The voltage identifier may be used by the control circuit 515 to determine a target voltage code (e.g., via the metal option bank 516) to set the target voltage and to program a set of anti-fuses of the anti-fuse bank 517 to program when the voltage trim code is determined. In some examples, the TSTCMD signal may include the target voltage, which may be used by the control circuit 515, rather than using a target voltage from the metal option bank 516.

In response to receipt of the TSTCMD signal, the test command decoder 564 may decode the TSTCMD signal to retrieve the voltage identifier, selection of one of a custom target voltage code or a default target voltage code from the metal option bank 516, and the custom target voltage code. The test command decoder 564 provides the voltage identifier to the metal option bank 516 and to the control logic 566. The metal option bank 516 provides the default target voltage code to the multiplexer 560. The test command decoder 564 provides the custom target voltage code to the multiplexer 560. The multiplexer 560 provides one of the custom target voltage code or the default target voltage code to the DAC 518 based on a control signal from the test command decoder 564. The value of the control signal may be based on the selection of one of the custom target voltage code or the default target voltage code retrieved from the TSTCMD signal. In response to the selected target voltage code received from the multiplexer 560, the DAC 518 may convert the VREF voltage to a target voltage, and provide the target voltage to one input of the comparator 514. It is appreciated that the use of the DAC 518 described with reference to FIG. 5 may also be implemented in the self-trimming circuits 210, 310, and/or 410 of FIGS. 2-4, respectively, to convert the VREF voltage to a different voltage based on an indicated voltage to be tested from the TSTCMD signal.

In response to the voltage identifier received from the test command decoder 564, the control logic 566 may provide an initial voltage trim code to the variable impedance device 534 and may provide the switch signal to the switching circuit 513 to connect the output of the output buffer 540 to the second input of the comparator 514. The voltage trim code may adjust an impedance of the variable impedance device 534, which may adjust an output voltage provided by the amplifier 532. The output buffer 540 drives the output voltage of the amplifier 532 to the comparator 514 via the switching circuit 513. The comparator 514 compares the target voltage from the DAC 518 to the output voltage from the output buffer 540 and provides the stop signal having a value based on the comparison. The control logic 566 adjusts the voltage trim code provided to the reference voltage regulator 511 based on the stop signal. When the stop signal indicates that the target voltage matches the output voltage from the reference voltage regulator 511, in some examples, the control logic 566 completes the self-trimming process by programming a set of anti-fuses of the anti-fuse bank 517. The set of anti-fuses is selected based on the voltage identifier in the TSTCMD signal. In other examples, the anti-fuses are not programmed during the self-trimming operation.

FIG. 6 is an example frame 600 for a test command signal TSTCMD during a self-trimming operation in accordance with an embodiment of the disclosure. The example frame 600 may be implemented in the TSTCMD signal received at the DQ pad in the semiconductor device 100 of FIG. 1, the system 200 of FIG. 2, the system 300 of FIG. 3, the system 400 of FIG. 4, the system 500 of FIG. 5, or combinations thereof. The example frame 600 includes a first portion 610 that includes a voltage identifier, a second portion 620 that includes a custom target voltage code, a fuse bit 630 that indicates whether the fuses are to be programmed during the self-trimming operation, and a parity bit 640 to indicate whether the example frame data 600 is valid. In some examples, a bit of the second portion 620 may be assigned to indicate selection of a custom target voltage code or a default target voltage code. The example frame 600 is exemplary, and it would not deviate from the scope of the disclosure if the individual bits of the frame 600 were arranged in a different order, if the frame 600 included more or fewer bits, and if each individual section 610, 620, 630, and 640 included more or fewer bits.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the disclosure should not be limited by the particular disclosed embodiments described above.

What is claimed is:

1. An apparatus comprising:
    a semiconductor device comprising a self-trimming circuit configured to receive a reference voltage and a test command signal, the self-trimming circuit configured to convert the reference voltage to a target voltage based on the test command signal and further configured to adjust a voltage trim code until an internal voltage matches the target voltage to determine a trim level associated with the internal voltage.

2. The apparatus of claim 1, wherein the self-trimming circuit comprises a reference voltage regulator configured to adjust an output voltage in response to the voltage trim code, wherein the output voltage is the internal voltage.

3. The apparatus of claim 1, wherein the self-trimming circuit comprises a control circuit configured to decode the test command signal to determine a target voltage code, wherein the target voltage code is used to determine the target voltage.

4. The apparatus of claim 3, wherein the self-trimming circuit further comprises a digital-to-analog converter configured to receive the reference voltage and to convert the reference voltage to the target voltage based on the target voltage code.

5. The apparatus of claim 3, wherein the self-trimming circuit further comprises a comparator configured to compare the target voltage with the internal voltage and to provide a stop signal having a value based on the comparison, wherein the control circuit is configured to adjust the voltage trim code based on a value of the stop signal.

6. The apparatus of claim 3, wherein the control circuit is configured to decode the test command signal to retrieve selection of one of a custom target voltage code or a default target voltage code as the target voltage code.

7. The apparatus of claim 6, wherein the self-trimming circuit further comprises a metal option bank configured to provide the default target voltage code based on a voltage identifier in the test command signal.

8. The apparatus of claim 6, wherein the control circuit is configured to decode the test command signal to retrieve the custom target voltage code.

9. A method comprising:
receiving a reference voltage and a test command signal at a semiconductor device;
converting the reference voltage to a target voltage based on the test command signal at the semiconductor device; and
adjusting a voltage trim code until an internal voltage matches the target voltage to determine a trim level associated with the internal voltage.

10. The method of claim 9, further comprising adjusting an output voltage of a voltage regulator in response to the voltage trim code, wherein the output voltage is the internal voltage.

11. The method of claim 9, further comprising decoding the test command signal to determine a target voltage code, wherein the target voltage code is used to determine the target voltage.

12. The method of claim 11, further comprising:
comparing the target voltage with the internal voltage; and
providing a stop signal having a value based on the comparison, wherein adjustment of the voltage trim code is based on a value of the stop signal.

13. The method of claim 11, further comprising decoding the test command signal to retrieve selection of one of a custom target voltage code or a default target voltage code as the target voltage code.

* * * * *